US010529731B2

(12) United States Patent
Shikata et al.

(10) Patent No.: US 10,529,731 B2
(45) Date of Patent: Jan. 7, 2020

(54) SEMICONDUCTOR MEMORY DEVICE IN WHICH DIFFERENT UPPER LIMIT VALUES ARE SET FOR PASS VOLTAGES

(71) Applicant: TOSHIBA MEMORY CORPORATION, Tokyo (JP)

(72) Inventors: Go Shikata, Yokohama Kanagawa (JP); Yasuhiro Shimura, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/909,369

(22) Filed: Mar. 1, 2018

(65) Prior Publication Data

US 2019/0088663 A1 Mar. 21, 2019

(30) Foreign Application Priority Data

Sep. 19, 2017 (JP) ................................. 2017-179336

(51) Int. Cl.
| | |
|---|---|
| *H01L 27/1157* | (2017.01) |
| *G11C 7/06* | (2006.01) |
| *G11C 8/08* | (2006.01) |
| *G06F 11/10* | (2006.01) |
| *G11C 16/08* | (2006.01) |
| *G11C 16/04* | (2006.01) |

(52) U.S. Cl.
CPC ...... *H01L 27/1157* (2013.01); *G06F 11/1044* (2013.01); *G11C 7/06* (2013.01); *G11C 8/08* (2013.01); *G11C 16/08* (2013.01); *G11C 16/0483* (2013.01)

(58) Field of Classification Search
CPC ....... H01L 27/1157; G11C 16/08; G11C 8/08; G11C 7/06; G11C 16/0483; G06F 11/1044

See application file for complete search history.

(56) References Cited

U.S. PATENT DOCUMENTS

| | | | |
|---|---|---|---|
| 7,916,545 B2 | 3/2011 | Fujiu | |
| 8,274,831 B2 | 9/2012 | Mokhlesi et al. | |
| 2007/0291542 A1* | 12/2007 | Aritome ............. | G11C 16/0483 365/185.18 |

(Continued)

FOREIGN PATENT DOCUMENTS

| | | |
|---|---|---|
| JP | 5178167 B2 | 4/2013 |
| JP | 2016-170835 A | 9/2016 |

OTHER PUBLICATIONS

Tanaka et al. "Bit Cost Scalable Technology with Punch and Plug Process for Ultra High Density Flash Memory," Digest of Technical Papers, IEEE Symposium on VLSI Technology, Jul. 2007, pp. 14-15.

*Primary Examiner* — Jerome Leboeuf
(74) *Attorney, Agent, or Firm* — Kim & Stewart LLP

(57) ABSTRACT

A semiconductor memory device includes a first memory cell transistor, a second memory cell transistor, and a third memory cell transistor that are connected in series. A word line is coupled to a gate of the third memory cell transistor. A controller is configured to set a first upper limit value for voltages applied to the word line during writing of data to the first memory cell transistor and a second upper limit value for voltages applied to the word line during writing of data to the second memory cell transistor. The second upper limit value is different from the first upper limit value.

12 Claims, 9 Drawing Sheets

(56) References Cited

U.S. PATENT DOCUMENTS

| | | | |
|---|---|---|---|
| 2009/0141557 A1* | 6/2009 | Fujiu | G11C 11/5628 365/185.19 |
| 2010/0124120 A1* | 5/2010 | Park | G11C 16/0483 365/185.19 |
| 2013/0148430 A1 | 6/2013 | Shiino et al. | |
| 2015/0228345 A1 | 8/2015 | Kwon et al. | |
| 2015/0348637 A1* | 12/2015 | Han | G11C 16/16 365/185.2 |
| 2016/0071595 A1* | 3/2016 | Dong | G11C 16/10 365/185.17 |
| 2016/0267990 A1 | 9/2016 | Bushnaq et al. | |

* cited by examiner

SEMICONDUCTOR MEMORY DEVICE IN WHICH DIFFERENT UPPER LIMIT VALUES ARE SET FOR PASS VOLTAGES

CROSS-REFERENCE TO RELATED APPLICATION

This application is based upon and claims the benefit of priority from Japanese Patent Application No. 2017-179336, filed Sep. 19, 2017, the entire contents of which are incorporated herein by reference.

FIELD

Embodiments described herein relate generally to a semiconductor memory device.

BACKGROUND

An NAND-type flash memory is known as a semiconductor memory device.

DETAILED DESCRIPTION

Figure 1:
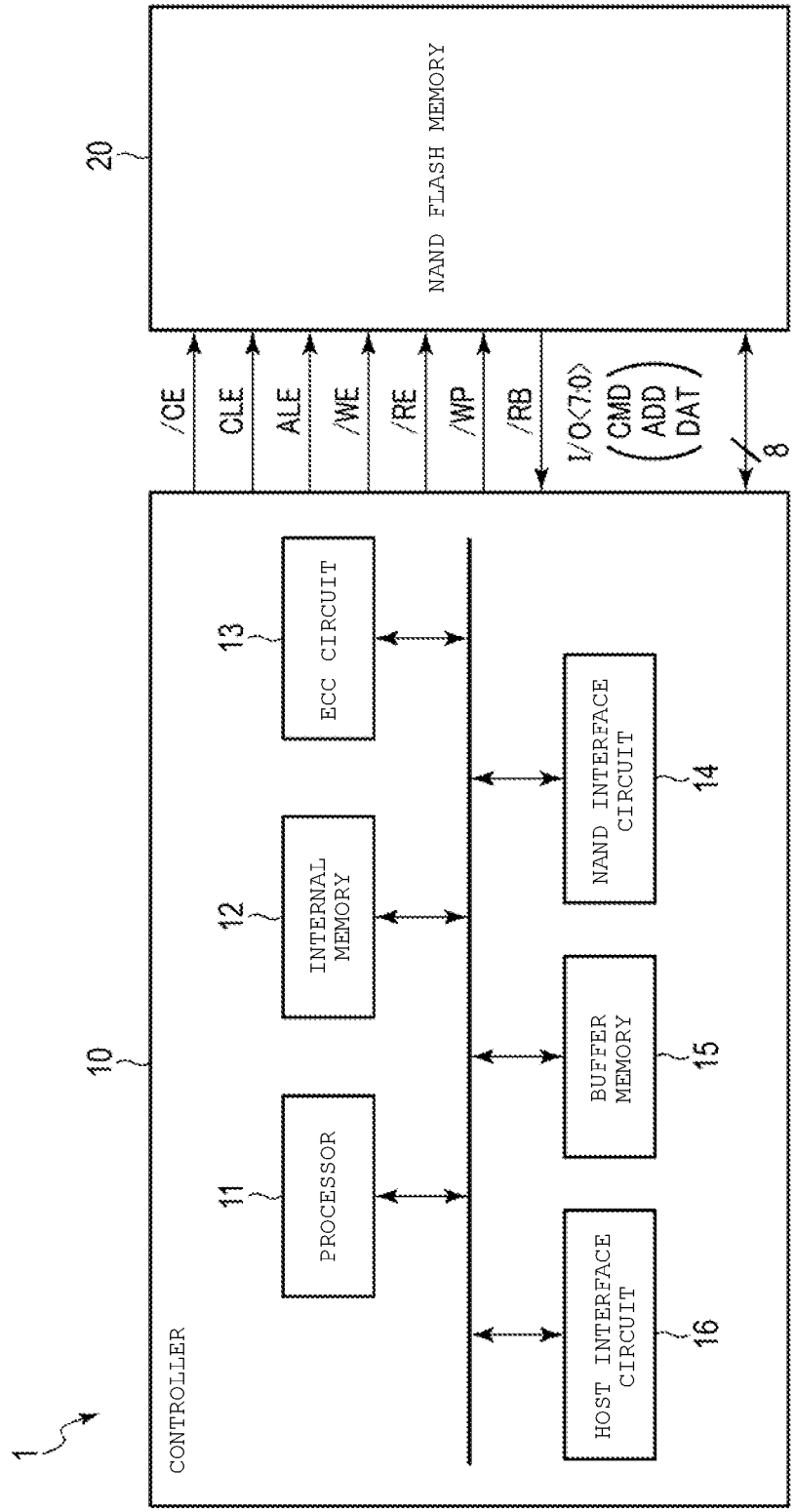
FIG. 1 is a block diagram for describing a memory system according to an embodiment.

In general, according to one embodiment a semiconductor memory device comprises a first memory cell transistor, a second memory cell transistor, and a third memory cell transistor that are connected in series. A word line is coupled to a gate of the third memory cell transistor. A controller is configured to set a first upper limit value for voltages applied to the word line during writing of data to the first memory cell transistor, and set a second upper limit value for voltages applied to the word line during writing of data to the second memory cell transistor. The second upper limit value is different from the first upper limit value.

Embodiments will be described below with reference to the accompanying drawings. In the following description, constituent elements having substantially the same functions and configurations are denoted by the same reference numerals.

1. First Embodiment

A semiconductor memory device according to a first embodiment will be described. The semiconductor memory device according to the first embodiment includes, for example, a NAND-type flash memory.

1.1 Configuration

First, the semiconductor memory device according to the first embodiment will be described.

1.1.1 Memory System

An example of a memory system according to the first embodiment will be described with reference to FIG. 1. FIG. 1 is a block diagram illustrating an example of the memory system according to the first embodiment. A memory system 1 communicates with, for example, an external host device. The memory system 1 stores data sent from the host device and sends read data to the host device.

As illustrated in FIG. 1, the memory system 1 includes a controller 10 and a semiconductor memory device 20, which may also be referred to as a NAND flash memory 20, in some examples. The controller 10 receives a command from the host device and controls the semiconductor memory device 20 based on the received command. Specifically, the controller 10 writes data as instructed by the host device to the semiconductor memory device 20, reads data from the semiconductor memory device 20 as instructed by the host device, and transmits the read data to the host device. The controller 10 is connected to the semiconductor memory device 20 through a NAND bus or the like. The semiconductor memory device 20 includes a plurality of memory cells and stores data in a nonvolatile manner.

The NAND bus transmits and receives signals /CE, CLE, ALE, /WE, /RE, /WP, /RB, and I/O<7:0>via individual signal lines according to a NAND interface. The signal /CE is a signal for enabling the semiconductor memory device 20. The signal CLE is used to notify the semiconductor memory device 20 that the signal I/O<7:0>received by the semiconductor memory device 20 is a command when the signal CLE is at an "H (High)" level. The signal ALE is used to notify the semiconductor memory device 20 that the signal I/O<7:0>received by the semiconductor memory device 20 is an address when the signal ALE is at an "H (High)" level. The signal /WE is used to instruct the semiconductor memory device 20 to capture the signal I/O<7:0> received by in the semiconductor memory device 20 when the signal /WE is at an "L (Low)" level. The signal /RE is used to instruct the semiconductor memory device 20 to output the signal I/O<7:0>. The signal /WP is used to instruct the semiconductor memory device 20 to prohibit data writing and erasing. The signal /RB is used to indicate whether the semiconductor memory device 20 is in a ready state where a command from the outside can be accepted or a busy state where a command from the outside cannot be accepted). The signal I/O<7:0>is, for example, an 8-bit signal. The signal I/O<7:0>corresponds to a data unit transmitted and received between the semiconductor memory device 20 and the controller 10, and includes a command CMD, an address ADD, and data DAT. The data DAT can be write data or read data.

1.1.2 Controller

The controller of the memory system according to the first embodiment will be described with reference to FIG. 1. The controller 10 includes a processor 11 (for example, a CPU (Central Processing Unit)), an internal memory 12 (for example, RAM (Random Access Memory)), and Error Check and Correction (ECC) circuit 13, a NAND interface circuit 14, a buffer memory 15, and a host interface circuit 16.

The processor 11 controls an overall operation of the controller 10. The processor 11 issues a read command based on a NAND interface protocol to the semiconductor memory device 20 in response to a data read command received from the host device, for example. A similar operation also applies to a write operation and an erasing operation. Furthermore, the processor 11 has a function of executing various arithmetic operations on data read from the semiconductor memory device 20.

The internal memory 12 is a semiconductor memory such as DRAM (Dynamic RAM), and is used as a work area of the processor 11. The internal memory 12 stores firmware for managing the semiconductor memory device 20 and various management tables.

The ECC circuit 13 performs error detection and error correction processing. More specifically, when data is written, the ECC circuit generates an ECC code for the data received from the host device. An ECC code maybe established for each page or other grouping of data to be written. When data is read out, the ECC circuit performs ECC decoding based on the ECC code to detect the presence or absence of an error. When an error is detected, the ECC circuit can specify a bit position of the error and correct the error.

The NAND interface circuit 14 is connected to the semiconductor memory device 20 via the NAND bus and controls communication with the semiconductor memory device 20. The NAND interface circuit 14 transmits the command CMD, the address ADD, and the write data to the semiconductor memory device 20 under the instruction of the processor 11. In addition, the NAND interface circuit 14 receives data read ("read data") from the semiconductor memory device 20.

The buffer memory 15 temporarily stores data received from the semiconductor memory device 20 or the host device by the controller 10. The buffer memory 15 is also used, for example, as a storage area for temporarily storing the read data from the semiconductor memory device 20 and results of an arithmetic operation on the read data.

The host interface circuit 16 is connected to the host device and controls communication with the host device. For example, the host interface circuit 16 transfers commands and data received from the host device to the processor 11 and the buffer memory 15, respectively.

1.1.3 Semiconductor Memory Device

Figure 2:
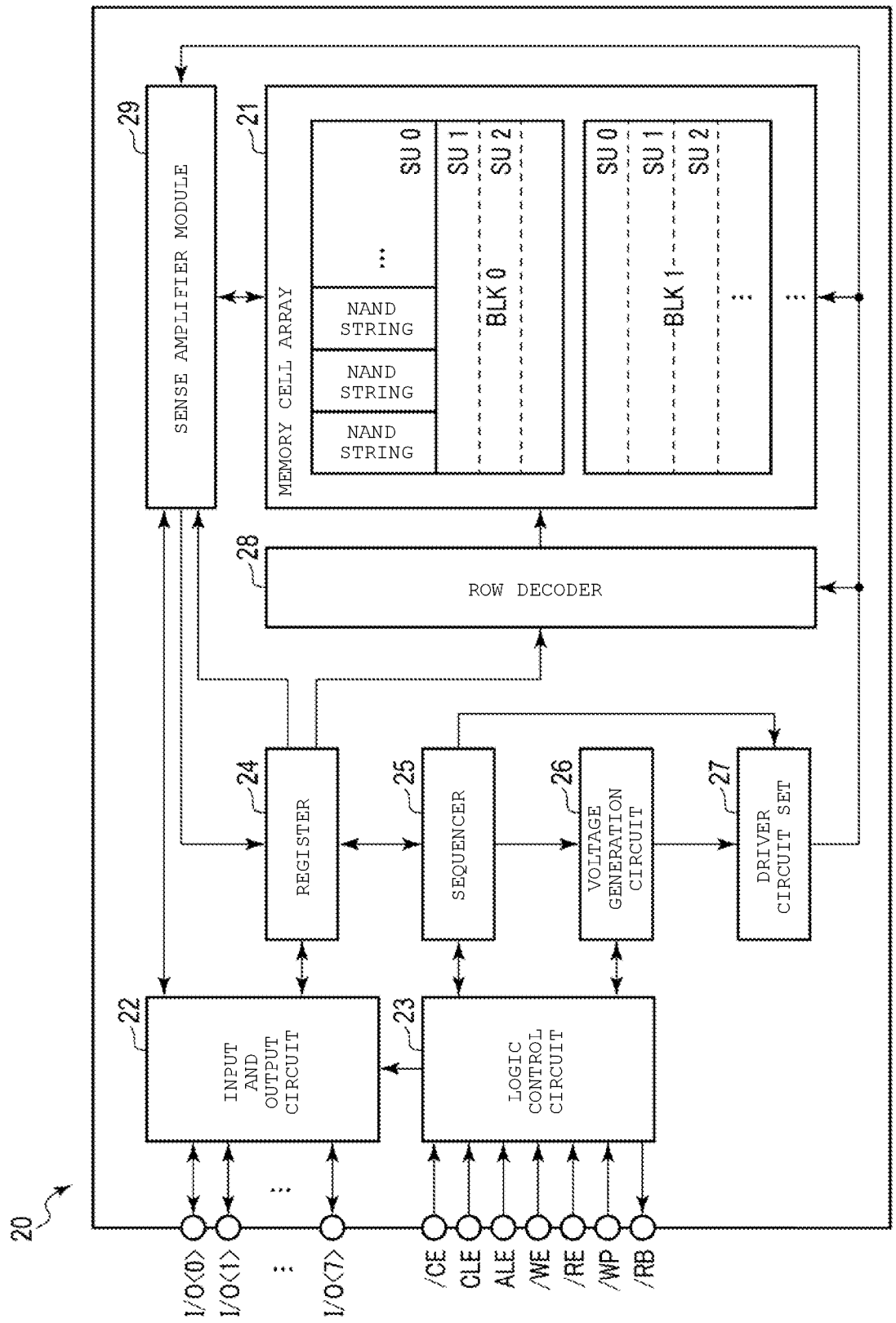
FIG. 2 is a block diagram for describing a semiconductor memory device according to an embodiment.

An example of the semiconductor memory device 20 according to the first embodiment will be described with reference to FIG. 2. FIG. 2 is a block diagram illustrating an example of the semiconductor memory device 20 according to the first embodiment.

A semiconductor memory device 20 includes a memory cell array 21, an input and output circuit 22, a logic control circuit 23, a register 24, a sequencer 25, a voltage generation circuit 26, a driver circuit set 27, a row decoder 28, and a sense amplifier module 29.

The memory cell array 21 includes a plurality of blocks BLK (individually referred to as block BLK0, BLK1 . . . ). Each block BLK includes a plurality of nonvolatile memory cell transistors (not specifically illustrated) associated with word lines and bit lines. The block BLK is a typical unit for erasing of data, and as such data in the same block BLK will be erased simultaneously. Each block BLK includes a plurality of string units SU (individually referred to as string SU0, SU1, SU2 . . . ). Each string unit SU includes a set of NAND strings NS. Each NAND string NS includes a plurality of memory cell transistors. Hereinafter, the memory cell transistor is simply referred to as a "cell." The number of blocks in the memory cell array 21, the number of string units in one block BLK, and the number of NAND strings in one string unit SU may be freely set.

The input and output circuit 22 transmits and receives a signal I/O<7:0> to and from the controller 10. The input and output circuit 22 transfers a command CMD and an address ADD in the signal I/O<7:0> to the register 24. The input and output circuit 22 transmits and receives write data and read data to and from the sense amplifier module 29.

The logic control circuit 23 receives signals /CE, CLE, ALE, /WE, /RE, and /WP from the controller 10. In addition, the logic control circuit 23 transfers a signal/RB to the controller 10 to notify external devices of the state of the semiconductor memory device 20.

The register 24 stores the command CMD and the address ADD. The register 24 transfers the address ADD to the row decoder 28 and the sense amplifier module 29, and transfers the command CMD to the sequencer 25.

The sequencer 25 receives the command CMD, and controls the semiconductor memory device 20 according to a sequence based on the received command CMD.

The voltage generation circuit 26 generates a voltage necessary for operations such as a write operation, a read operation, and an erasing operation based on an instruction from the sequencer 25. The voltage generation circuit 26 supplies the generated voltage to the driver circuit set 27. The logic control circuit 23 directly transfers information to the voltage generation circuit such as an upper limit value of the voltage to be generated in the voltage generation circuit 26 for writing data. The upper limit value may vary, for example, according to whether the memory cell transistor being targeted in a writing operation is associated with any particular word line or group of word lines within the possible word lines.

The driver circuit set 27 includes a plurality of drivers, and supplies various voltages from the voltage generation circuit 26 to the row decoder 28 and the sense amplifier module 29 based on the address from the register 24. For example, the driver circuit set 27 supplies various voltages to the row decoder 28 based on the received row address.

The row decoder 28 receives the row address in the address ADD from the register 24, and selects, for example, a block BLK or other grouping based on a block address or the like in the row address. The voltage from the driver circuit set 27 is transferred to a selected block BLK via the row decoder 28.

When reading data, the sense amplifier module 29 senses (reads) data from the memory cell transistor via a bit line, and transfers the sensed data to the input and output circuit 22. When writing data, the sense amplifier module 29 transfers write data written to the memory cell transistor via a bit line. Furthermore, the sense amplifier module 29 receives a column address in the address ADD from the register 24, and outputs data from a column based on the column address.

1.1.4 Memory Cell Array

Figure 3:
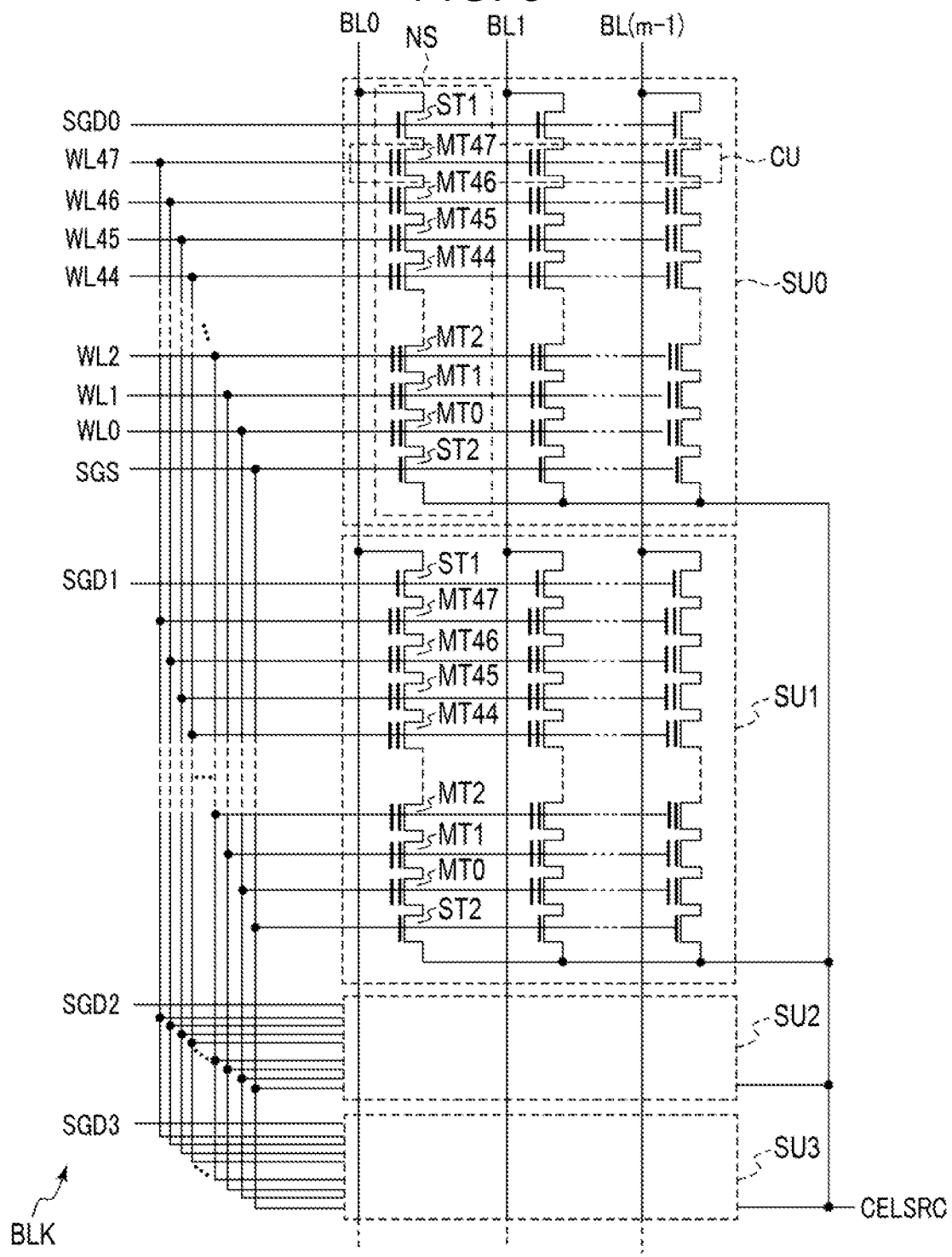
FIG. 3 is a circuit diagram for describing a memory cell array of the semiconductor memory device according to an embodiment.

The memory cell array of the semiconductor memory device according to the first embodiment will be described with reference to FIG. 3. FIG. 3 illustrates an example of a circuit diagram for describing the memory cell array of the semiconductor memory device according to the first embodiment.

As illustrated in FIG. 3, each of the NAND strings NS includes, for example, 48 memory cell transistors MT (MT0 to MT47) and selection transistors ST1 and ST2. The number of memory cell transistors MT is not limited to 48, and may be 8, 16, 32, 64, 96, 128, or the like. The total number of memory cell transistors is not specifically limited. Each memory cell transistor MT includes a stacked gate structure including a control gate and a charge storage layer. The respective memory cell transistors MT are connected in series between the selection transistors ST1 and ST2. In the example of FIG. 3, the memory cell transistor MT0 is provided adjacent to the selection transistor ST2 and the memory cell transistor MT47 is provided adjacent to the selection transistor ST1, but arrangement is not limited thereto. For example, a dummy memory cell transistor to which no data is written may be provided between the memory cell transistor MT0 and the selection transistor ST2 and/or between the memory cell transistor MT47 and the selection transistor ST1. A gate of such a dummy memory cell transistor would be connected to a dummy word line, for example. Note in the description below, that the meaning of the term "connection" includes indirect connection via one or more conductive elements.

In one block BLK, the gates of the selection transistors ST1 in the string units SU0 to SU3 are respectively connected to selection gate lines SGD0 to SGD3. The gates of the selection transistors ST2 in all the string units SU in the block BLK are commonly connected to a selection gate line SGS. The selection gate line SGS may be, similar to the selection gate line SGD, divided for each selection transistor ST2 in the string units SU0 to SU3 (in other words, the gates of the selection transistors ST2 in the string units SU0 to SU3 are respectively connected to selection gate lines SGS0 to SGS3 (not illustrated)). The control gates of the memory cell transistors MT0 to MT47 within the same block BLK are respectively connected to word lines WL0 to WL47. That is, the word lines WL of the same address are commonly connected to all the string units SU in the same block BLK, and the selection gate lines SGS are commonly connected to all the string units SU in the same block BLK. On the other hand, each selection gate line SGD is connected to only one of the string units SU in the same block BLK.

In addition, the other ends of the selection transistors ST1 in the NAND strings NS on the same row among the NAND strings NS arranged in a matrix configuration in the memory cell array 21 are connected to one of m bit lines BL (BL0 to BL (m−1) (where m is a natural number)). Each bit line BL is commonly connected to the NAND strings NS in the same column over the plurality of blocks BLK.

The other ends of the selection transistors ST2 are connected to a source line CELSRC. The source line CELSRC is commonly connected to the plurality of NAND strings NS over the plurality of blocks BLK.

As described above, data is collectively erased for the memory cell transistors MT in the same block BLK. On the other hand, reading and writing of data can be performed simultaneously on a plurality of memory cell transistors MT commonly connected to one word line WL in one string unit SU in one block BLK. The set of memory cell transistors MT sharing the same word line WL in one string unit SU is referred to as a "cell unit CU", for example. That is, the cell unit CU is a set of memory cell transistors MT on which a write operation or a read operation can be performed simultaneously.

Each memory cell transistor MT can store data of a plurality of bits. A set of 1-bit data stored by each of the memory cell transistors MT at the same-order bit in the same cell unit CU is referred to as a "page". That is, a "page" can be defined as a part of the memory space formed in the set of memory cell transistors MT in the same cell unit CU.

Figure 4:
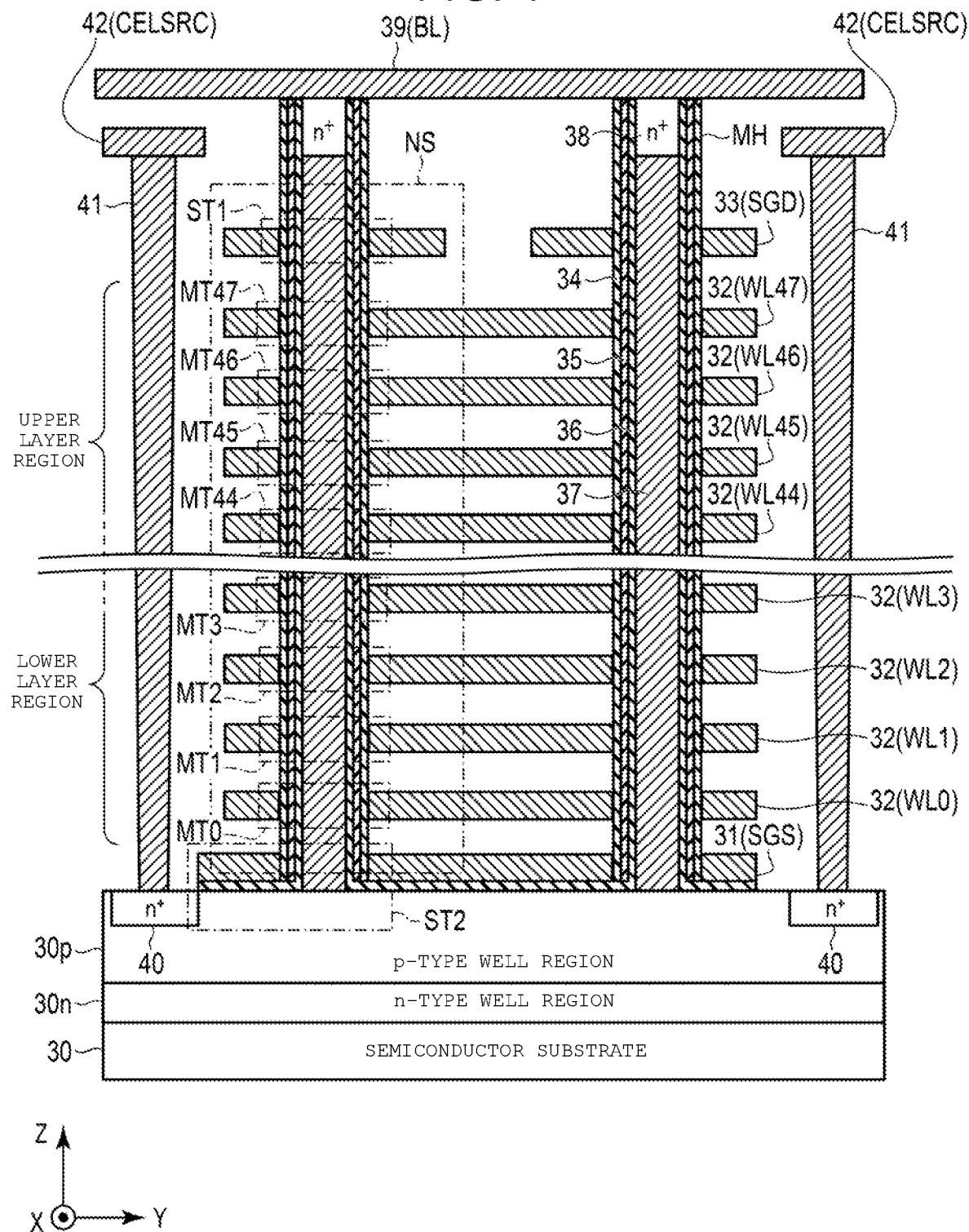
FIG. 4 is a cross-sectional view for describing the memory cell array of the semiconductor memory device according to an embodiment.

The cross-sectional structure of memory cell array 21 will be described with reference to FIG. 4. FIG. 4 illustrates an example of the structure of part of the memory cell array of the semiconductor memory device according to the first embodiment. Particularly, FIG. 4 illustrates a portion associated with two string units SU0 and SU1 in one block BLK. More specifically, FIG. 4 illustrates two NAND strings NS in each of the two string units SU0 and SU1 and their peripheral portions. The plurality of NAND strings NS illustrated in FIG. 4 are arrayed in the X direction and the Y direction, and a set of NAND strings NS arranged in the X direction and the Y direction corresponds to one string unit SU.

The semiconductor memory device 20 is provided on a semiconductor substrate 30. In the following description, a plane parallel to a main surface of the semiconductor substrate 30 is set as an X-Y plane, and a direction orthogonal to the X-Y plane is set as a Z direction. The X and Y directions are perpendicular to each other.

An n-type well region 30n is provided on the semiconductor substrate 30, and a p-type well region 30p is provided on the n-type well region 30n. A plurality of NAND strings NS is provided on the p-type well region 30p. That is, for example, an interconnect layer 31 functioning as the selection gate line SGS, 48 interconnect layers 32 (WL0 to WL47) respectively functioning as word lines WL0 to WL47, and an interconnect layer 33 functioning as the selection gate line SGD are sequentially stacked on the p-type well region 30p. A plurality of interconnect layers 31 and a plurality of interconnect layers 33 may be stacked. Insulating films (not specifically depicted) are provided between the stacked interconnect layers 31, 32, and 33.

The interconnect layer 31 is commonly connected to the gates of the selection transistors ST2 of the plurality of NAND strings NS in one block BLK. Each of the interconnect layers 32 is commonly connected to the control gates of the memory cell transistors MT of the plurality of NAND strings NS in one block BLK. The interconnect layer 33 is commonly connected to the gates of the selection transistors ST1 of the plurality of NAND strings NS in one string unit SU.

Memory holes MH reach the p-type well region 30p by penetrating through the interconnect layers 33, 32, and 31. A block insulating film 34, a charge storage layer 35, and a tunnel oxide film 36 are sequentially provided on the peripheral surface of each memory hole MH. A semiconductor pillar 37 is formed in each memory hole MH. The semiconductor pillar 37 is made of undoped polysilicon or the like and functions as a current path of a NAND strings NS. An $n^+$-type impurity diffusion area 38 is provided on upper end of the semiconductor pillar 37, and an interconnect layer 39 functioning as the bit lines BL is provided on the $n^+$-type impurity diffusion area 38.

As described above, the selection transistor ST2, the plurality of memory cell transistors MT, and the selection transistor ST1 are sequentially stacked on the p-type well region 30p, and each memory hole MH corresponds to one NAND string NS.

An $n^+$-type impurity diffusion area 40 is provided on the p-type well region 30p. A contact plug 41 is provided on the upper surface of the $n^+$-type impurity diffusion area 40. An interconnect layer 42 functioning as the source line CELSRC is provided on the upper surface of the contact plug 41.

In general, the memory cell array 21 may have other configurations. For example, the configuration of the memory cell array 21 can correspond to that described in U.S. patent application Ser. No. 12/407,403 "Three dimensional stacked nonvolatile semiconductor memory," filed Mar. 19, 2009. Likewise, the configuration described in U.S. patent application Ser. No. 12/406,524 "Three dimensional stacked nonvolatile semiconductor memory," filed Mar. 18, 2009, U.S. patent application Ser. No. 12/679,991 "Nonvolatile semiconductor memory device and method of manufacturing the same," filed Mar. 25, 2010, and/or U.S. patent application Ser. No. 12/532,030 "Semiconductor memory and method for manufacturing same," filed Mar. 23, 2009, can be adopted. Furthermore, the entire contents of the above-reference patent applications are incorporated herein by reference.

The plurality of memory cell transistors MT in one NAND string NS is further classified into a first set of memory cell transistors MT and a second set of memory cell transistors MT. The first and second sets of memory cell transistors MT are each formed of a plurality of memory cell transistors MT provided continuously. Specifically, the first set of memory cell transistors MT includes L (where L is an integer of 1≤L<48) memory cell transistors MT continuously provided including a particular memory cell transistor MT that is adjacent to the selection transistor ST2 (in the example of FIG. 4, this particular memory cell transistor MT would be the memory cell transistor MT0). The second set of memory cell transistors MT is provided above the first set of memory cell transistors MT. That is, the second set of memory cell transistors MT includes (48-L) memory cell transistors MT continuously provided including a particular memory cell transistor MT adjacent to the selection transistor ST1 (in the example of FIG. 4, this particular memory cell transistor would be memory cell transistor MT47).

In the following description, a region along the Z direction in which the first set of the memory cell transistors MT is provided is referred to as a "lower layer region", and a region along the Z direction in which the second set of the memory cell transistors MT is provided is referred to as an "upper layer region". The first set of the memory cell transistors MT is referred to as, for example, "a set of cells in the lower layer region on the side of the selection transistor ST2" or "a set of cells in the lower layer region", and the second set of the memory cell transistors MT is referred to as, for example, "a set of cells in the upper layer region on the side of the selection transistor ST1" or "a set of cells in the upper layer region". The set of cells in the upper layer region on the side of the selection transistor ST1 or the set of cells in the upper layer region may include a dummy cell transistor.

1.2 Write Operation

A write operation of the semiconductor memory device according to the first embodiment will be described below.

In the following description, when the memory cell transistor MT and the word line WL connected to the memory cell transistor MT are objects to which data is to be written, the term "selected" is attached to each name. In addition, when the data is not to be written, the term "non-selected" is attached to each name. In the following description, when there is a dummy word line and a dummy cell transistor, these components are always regarded as non-selected.

1.2.1 Outline of Write Operation

First, an outline of the write operation according to the first embodiment will be described.

The write operation includes a plurality of program operations which are repeatedly executed. The program operation is an operation of injecting electrons into the charge storage layer 35 of the selected memory cell transistor MT to raise the threshold voltage or prohibiting the injection of electrons to maintain the threshold voltage. When the program operation is repeated several times, the threshold voltage of the selected memory cell transistor MT is raised to a predetermined value. A repeating unit of the program operation can be referred to as a "loop".

Hereinafter, among the data write operations including the plurality of program operations, a write operation on one cell out of the set of cells in the lower layer region on the side of the selection transistor ST2 and a write operation on one cell out of the set of cells in the upper layer region on the side of the selection transistor ST1 are described.

1.2.2 Write Operation on Cell in Lower Layer Region

First, a write operation on a cell in the lower layer region on the side of the selection transistor ST2 will be described.

Figure 5:
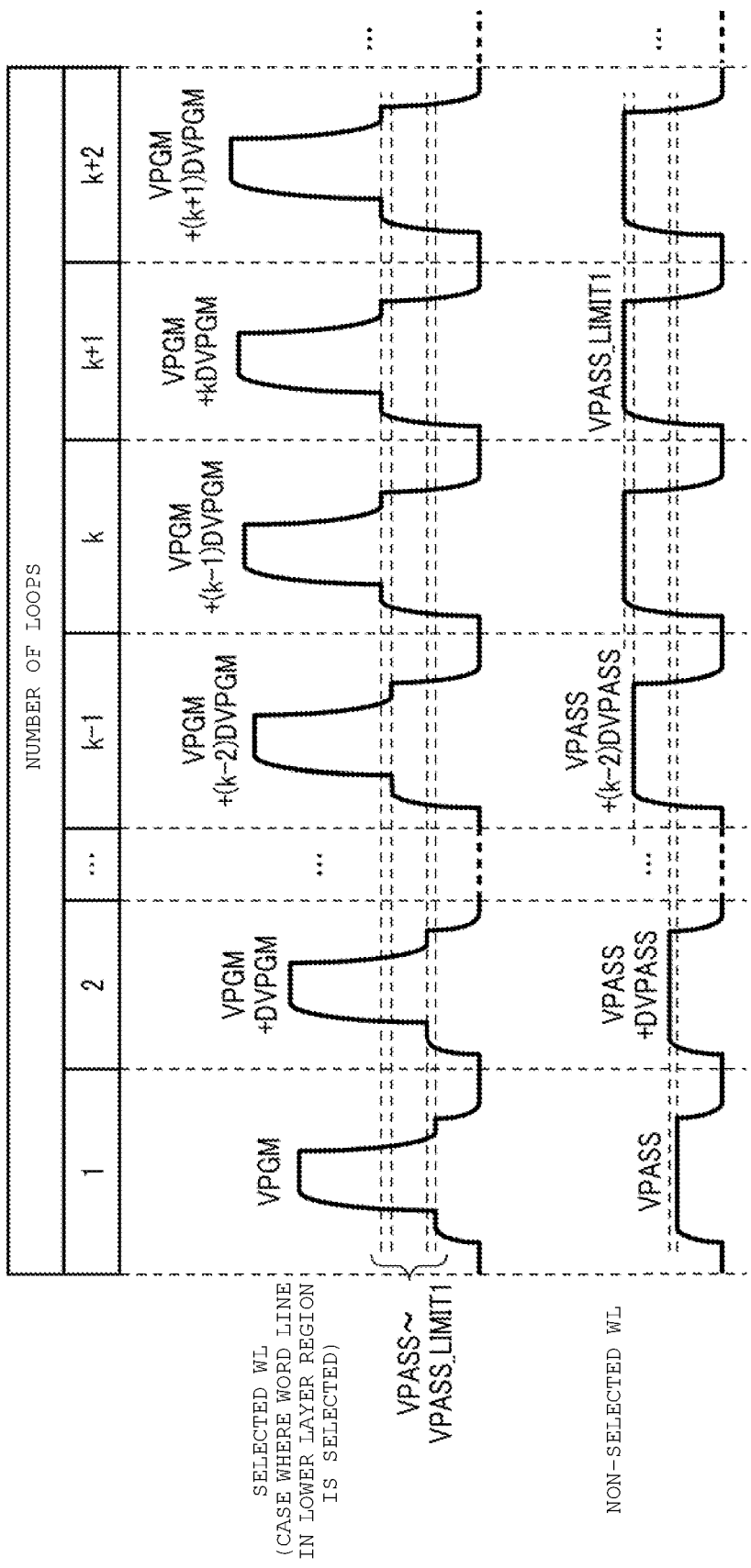
FIG. 5 is a timing chart for explaining aspects of a write operation when a word line in a lower layer region is selected in the semiconductor memory device according to an embodiment.

FIG. 5 is a timing chart for describing the write operation on the cell in the lower layer region in the semiconductor memory device of the first embodiment. That is, FIG. 5 illustrates a case where a word line WL connected to the cell in the lower layer region.

In a first loop, as illustrated in FIG. 5, a voltage VPGM is applied to a selected word line WL after a voltage VPASS has been applied, and electrons are injected into the charge storage layer 35 of the selected memory cell transistor MT. The voltage VPASS is also applied to a non-selected word line WL.

In a NAND string NS including a selected memory cell transistor MT to which electrons are injected, the voltage VPASS controls a program with respect to a non-selected memory cell transistor MT. Further, in a NAND string NS including a selected memory cell transistor MT to which electrons are not injected, the voltage VPASS has a magnitude enough to raise (boost) a potential of a channel by coupling to the extent that the increasing of the threshold voltage at the selected memory cell transistor MT can be prevented. The voltage VPGM is a voltage used to inject electrons into the charge storage layer 35 of the memory cell transistor MT, and is larger than the voltage VPASS.

After an application of the voltage VGPM to the selected memory cell transistor MT, a voltage VPASS is applied to the selected word line WL. Subsequent to this, a voltage VSS is applied to both the selected word line WL and the non-selected word line WL, and the first program operation is completed.

In a second loop, the voltages VPGM and VPASS are each stepped up by the voltages DVPGM and DVPASS, respectively, from the first loop.

Specifically, in the second loop, a voltage VPGM+DVPGM is applied to the selected word line WL after a voltage VPASS+DVPASS has been applied. Thus, the voltage VPASS+DVPASS is applied to the non-selected word line WL.

After application of the program voltage VPGM+DVPGM, the voltage VPASS+DVPASS is applied to the selected word line WL. Subsequent to this, a voltage VSS is applied to both the selected word line WL and the non-selected word line WL, and the second program operation is completed.

In the program operation, as described above, as the number of loops increases, the voltages that are applied to the selected word line WL and the non-selected word line WL are gradually stepped up in increments. As such, in a (k−1)-th loop (where k is a natural number of 2 or more), a voltage VPGM +(k−2)×DVPGM would be applied to the selected word line WL after a voltage VPASS+(k−2)×DV- PASS had been applied, and a voltage VPASS+(k−2)×DVPASS would be applied to the non-selected word line WL. Then, after the voltage VPASS+(k−2)×DVPASS has been applied to the selected word line WL, a voltage VSS will be applied to both the selected word line WL and the non-selected word line WL.

Subsequently, in at some loop number (here the k−th loop), a voltage applied that is applied to the non-selected word line WL will eventually be stepped up and reach a voltage VPASS_LIMIT1, which is an upper bound on the voltage applied to the non-selected word-line WL. The voltage VPASS_LIMIT1 is one piece of information transferred from the logic control circuit 23 to the voltage generation circuit 26 during the write operation, and sets an upper limit value for the voltage VPASS. In the example of FIG. 5, the voltage VPASS_LIMIT1 is greater than the voltage VPASS+(k−2)×DVPASS, but is equal to or less than the voltage VPASS+(k−1)×DVPASS. As a result, the voltage applied to the non-selected word line WL will not be stepped up to a larger value in any subsequent loop after the (k−1)-th loop.

That is, for the k−th and subsequent loops, for example, k−th, (k+1)-th, and (k+2)-th loops, after the voltage VPASS_LIMIT1 has been applied to the selected word line WL, voltages VPGM+(k−1)×DVPGM, VPGM+k×DVPGM, and VPGM+(k+1)×DVPGM will be applied, respectively, but in each of these instances the same voltage level (voltage VPASS_LIMIT1) is applied to the non-selected word line WL. After the voltage VPASS_LIMIT1 has been applied to the selected word line WL, the voltage VSS is applied to both the selected word line WL and the non-selected word line WL, and k−th, (k+1)-th, and (k+2)-th program operations are completed.

By the operation as described above, the write operation in the case where the word line WL in the lower layer region on the side of the selection gate line SGS is selected is completed.

1.2.3 Write operation on Cell in Upper layer region
Subsequently, a write operation on a cell in the upper layer region on the side of the selection transistor ST1 will be described.

Figure 6:
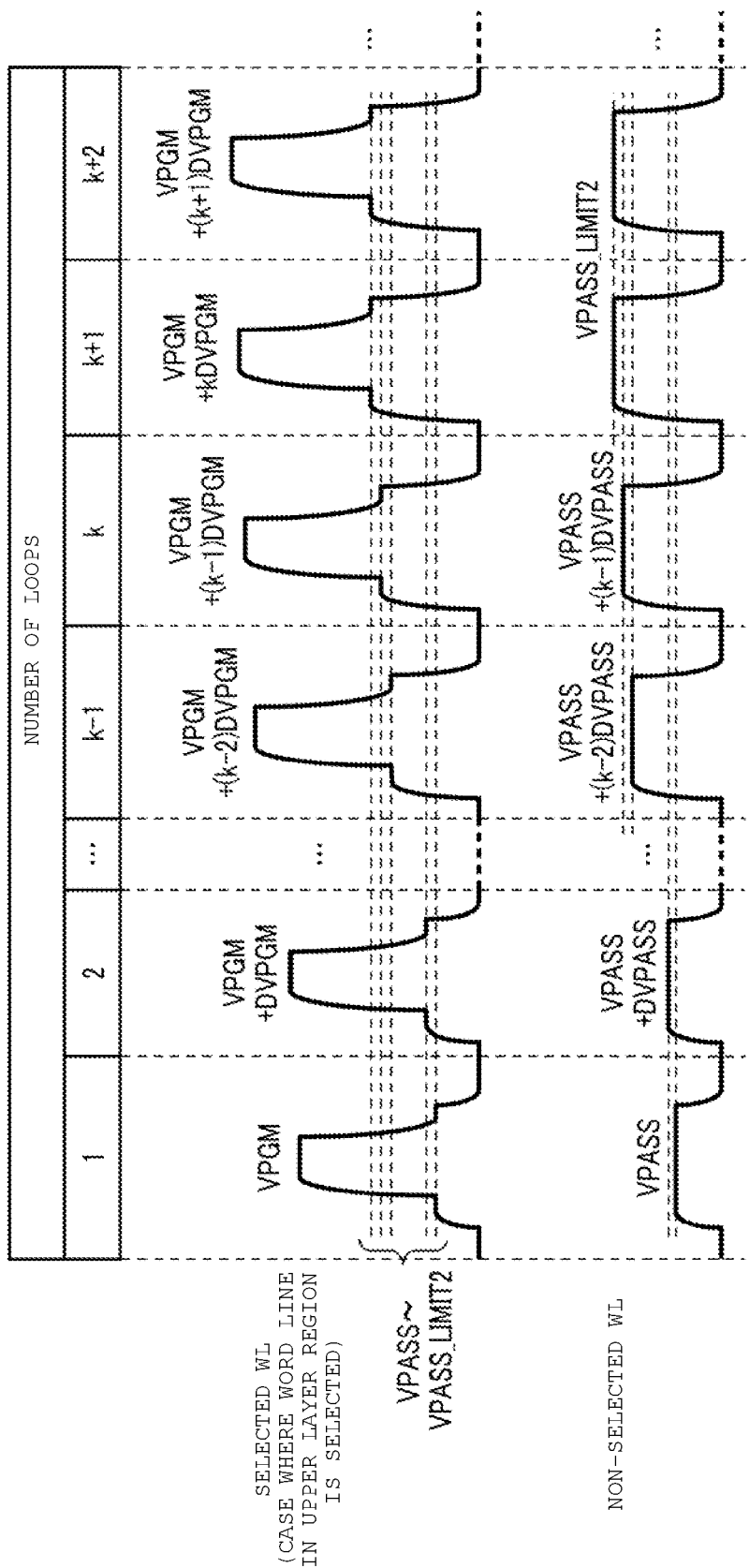
FIG. 6 is a timing chart for explaining aspects of a write operation when a word line in an upper layer region is selected in the semiconductor memory device according to an embodiment.

FIG. 6 is a timing chart for describing the write operation on the cell in the upper layer region in the semiconductor memory device of the first embodiment. That is, FIG. 6 illustrates a case where the word line WL connected to the cell in the upper layer region is selected.

As illustrated in FIG. 6, since an operation up to a (k−1)-th loop is the same as the write operation on the cell in the lower layer region illustrated in FIG. 5, the description thereof will not be re-presented.

In a k-th loop, a voltage applied to the non-selected word line WL is stepped up and reaches a voltage VPASS_LIMIT1. In subsequent loops after the k-th loop, however, the sequencer 25 continues to step up the voltage that is applied to the non-selected word line WL without limiting the stepped-up voltage at the voltage VPASS_LIMIT1.

Specifically, for example, in the k-th loop, after a voltage VPASS+(k−1)×DVPASS is applied to the selected word line WL, a voltage VPGM+(k−1)×DVPGM is applied. Thus, the voltage VPASS+(k−1)×DVPASS is applied to the non-selected word line WL. Thereafter, a voltage VPASS+(k−1)×DVPASS is applied to the selected word line WL. Subsequently, a voltage VSS is applied to both the selected word line WL and the non-selected word line WL, and the k-th program operation is completed.

Subsequently, in a (k+1)-th loop, a voltage applied to the non-selected word line WL is stepped up to reach a voltage VPASS_LIMIT2. The voltage VPASS_LIMIT2 is one piece of information transferred from the logic control circuit 23 to the voltage generation circuit 26 during the write operation, and is, for example, an upper limit value of the voltage VPASS different from the voltage VPASS_LIMIT1.

In the example of FIG. 6, the voltage VPASS_LIMIT2 is greater than the voltage VPASS+(k−1)×DVPASS, and is equal to or less than the voltage VPASS+k×DVPASS. In any subsequent loops, the voltage applied to the non-selected word line WL is not stepped up to a value larger than the voltage VPASS_LIMIT2.

That is, in the (k+1)-th and subsequent loops, for example, (k+1)-th and (k+2)-th loops, after the voltage VPASS_LIMIT2 has been applied to the selected word line WL, voltages VPGM+k×DVPGM and VPGM+(k+1)×DVPGM are applied, respectively. Thus, the voltage VPASS_LIMIT2 is applied to the non-selected word line WL. After the voltage VPASS_LIMIT2 is applied to the selected word line WL, the voltage VSS is applied to both the selected word line WL and the non-selected word line WL, and (k+1)-th and (k+2)-th program operations are completed.

By the operation as described above, the write operation in the case where the word line WL in the upper layer region on the side of the selection gate line SGD is selected is completed.

In the examples of FIGS. 5 and 6, the voltage applied to the non-selected word line WL reaches the voltage VPASS_LIMIT1 in the k-th loop and reaches the voltage VPASS_LIMIT2 in the (k+1)-th loop. However, this is for purposes of description and the relationship between the values VPASS_LIMIT1, VPASS_LIMIT2, and DVPASS is not limited thereto. In general, as long as the voltage VPASS_LIMIT2 is larger than the voltage VPASS_LIMIT1, the voltage applied to the non-selected word line WL can be set to a reachable size within some arbitrary number of additional loops of the (k+1) or more.

In the examples of FIGS. 5 and 6, the voltage applied to the non-selected word line WL starts the stepping up from the second loop in conjunction with the stepped-up voltage being applied to the selected word line WL, but embodiments are not limited thereto. For example, the voltage applied to the non-selected word line WL may start the stepping-up after some arbitrary number of loops.

In the examples of FIGS. 5 and 6, the same voltage (VPASS) is applied to all the non-selected word lines WL. However, embodiments are not limited thereto. For example, different voltages may be applied to different ones of the non-selected word line WL according to the position in the Z direction or otherwise.

1.3 Effects According to First Embodiment

According to the first embodiment, reliability of data writing can be improved. The effect will be described below.

According to the first embodiment, the voltage applied to the non-selected word line WL during the write operation is stepped up as the number of loops increases. At the time of data writing, the logic control circuit 23 transfers information indicating the upper limit value of the step-up voltage to the voltage generation circuit 26. Specifically, when the cell in the lower layer region on the side of the selection transistor ST2 is selected, the voltage VPASS_LIMIT1 is transferred to the voltage generation circuit 26, as the upper limit value of the voltage that can be applied to the non-selected word line WL. In addition, when the cell in the upper layer region on the side of the selection transistor ST1 is selected, the voltage VPASS_LIMIT2 is transferred to the voltage generation circuit 26, as the upper limit value of the voltage that can be applied to the non-selected word line WL. The voltage VPASS_LIMIT2 is set to a value larger than the voltage VPASS_LIMIT1. Thus, as compared to the case where data is written to the cell in the lower layer region, when data is written to the cell in the upper layer region, a higher voltage can be applied to the non-selected word line WL. For this reason, when the data is written to the cell in the upper layer region, the influence of program disturbance can be reduced. Therefore, the reliability of writing can be improved.

Additionally, the semiconductor memory device 20 is configured in which the selection transistor ST2, the plurality of memory cell transistors MT, and selection transistor ST1 are provided along the Z direction perpendicular to the semiconductor substrate 30. Therefore, the plurality string units SU0 to SU3 are provided in one block BLK to share the same word line WL. In this case, the plurality string units SU0 to SU3 provided in the same block BLK can be selected or not be selected depending on whether the selection transistor ST1 is turned on or off. On the other hand, as described above, the plurality string units SU0 to SU3 provided in the same block BLK shares the same word line WL. Therefore, the same voltage as a voltage applied to a gate of the memory cell transistor MT in the selected string unit SU is applied to a gate the memory cell transistor MT in the non-selected string unit SU.

In the memory cell transistor MT connected to the selected word line WL in the non-selected string unit SU, generally, the potential of the channel in a floating state is boosted by coupling with the voltage of the word line WL, and thus unintended writing is prevented. However, the boost amount of the potential of the channel can be reduced by various factors.

For example, the boost amount of the potential of the channel can be reduced by coupling with electrons injected into the charge storage layer 35 of the non-selected memory cell transistor MT on the side of the selection transistor ST2. Here, writing is sequentially performed from the selection transistor ST2 (source side) toward the selection transistor ST1 (drain side) in the plurality of memory cell transistor MT provided in one NAND string NS. Thus, when data is written to the memory cell transistor MT in the upper layer region, there is a high possibility that data is already loaded in many of the memory cell transistors MT located on the source side of the selected memory cell transistor MT. For this reason, as compared with the selected memory cell transistor MT in the lower layer region, the selected memory cell transistor MT in the upper layer region likely to be more influenced by coupling with the electrons injected into the charge storage layer 35 of the memory cell transistor MT on the source side, and thus the boost amount of the potential of the channel tends to decrease.

For example, the selected memory cell transistor MT in the upper layer region is closer to the bit line BL compared to the selected memory cell transistor MT in the lower layer region. For this reason, the potential of the boosted channel can leak to the bit line BL.

Accordingly, during the write operation, the potential of the channel may not be easily boosted to a sufficient magnitude in a selected memory cell transistor MT in the upper layer region as compared to a selected memory cell transistor MT in the lower layer region.

Figure 7:
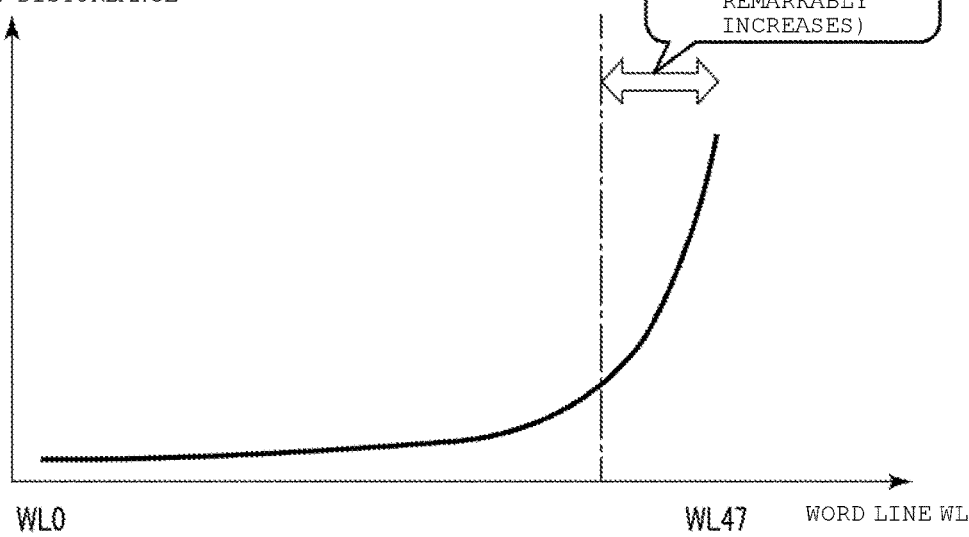
FIG. 7 is a diagram for describing aspects of a program disturbance.

FIG. 7 is a diagram for describing program disturbance. In FIG. 7, a horizontal axis represents a selected word line WL. In FIG. 7, a vertical axis represents the amount of increase in the threshold voltage occurring in the memory cell transistor MT connected to the selected word line WL in the non-selected string unit SU. That is, FIG. 7 illustrates an example correspondence relation between the selected word line WL and the amount of increase in the threshold voltage due to the program disturbance.

As illustrated in FIG. 7, when the word line WL0 or the word line WL corresponding to the lower layer region near it is selected, the amount of increase in the threshold voltage occurring in the memory cell transistor MT connected to the selected word line WL in the non-selected string unit SU is relatively small. However, as the selected word line WL goes toward the upper layer, the amount of increase in the threshold voltage increases. Then, when the word line WL47 or the word line WL corresponding to the upper layer region near it is selected, the amount of increase in the threshold voltage occurring in the memory cell transistor MT connected to the selected word line WL in the non-selected string unit SU can considerably be increased to a non-negligible extent as compared with the case where the word line WL corresponding to the lower layer region is selected. Particularly, when the word line WL47 is selected, the amount of increase in the threshold voltage occurring in the memory cell transistor MT connected to the selected word line WL in the non-selected string unit SU becomes significant as compared with the case where other word lines WL are selected.

In the first embodiment, when the memory cell transistor MT in the upper layer region is written, an upper limit value of the voltage applied to the non-selected word line WL is set to the voltage VPASS_LIMIT2, which is larger than the voltage VPASS_LIMIT1. This makes it possible to compensate for a decrease in the boost amount of the potential of the channel which can occur in the memory cell transistors MT in the upper layer region. For this reason, it is possible to prevent the increase in the threshold voltage that is significantly exhibited in the memory cell transistor MT in the upper layer region. Therefore, the reliability of data writing can be improved.

When too large of a voltage is applied to the non-selected word line WL, data may be unintentionally written to the non-selected memory cell transistor MT connected to the non-selected word line WL. For this reason, in the case where the program disturbance due to the decrease in the boost amount of the potential of the channel as described above does not occur, a voltage not exceeding the voltage VPASS_LIMIT1 is desirably applied to the non-selected word line WL.

Specifically, as illustrated in FIG. 7, when the memory cell transistor MT in the lower layer region is written, the decrease in the boost amount as described above does not substantially appear. Therefore, in the first embodiment, when the memory cell transistor MT in the lower layer region is written, the voltage VPASS_LIMIT1 instead of the voltage VPASS_LIMIT2 is set as the upper limit value of the voltage VPASS applied to the non-selected word line WL. Accordingly, it is possible to reduce, the cases where the voltage VPASS_LIMIT2 is applied to the non-selected word line WL, and thus to prevent data from being unintentionally written to the non-selected memory cell transistor MT.

2. Modification

In addition to the first embodiment described above, various modifications can be made. In the first embodiment described above, the description has been made on the case in which two or more different upper limit values are set for the voltage VPASS depending on whether the selected word line WL is in the upper or lower layer region. It should be noted that the disclosure is not limited thereto. For example, a plurality of different voltages maybe set for the non-selected word lines WL depending on their positional relation with the selected word line WL. In addition, a plurality of different upper limit values may be set for each the different types voltages depending on whether the selected word line WL is in the upper layer region or otherwise.

Hereinafter, configurations and operations similar to those in the first embodiment will not be described, and configurations and operations different from those in the first embodiment will be mainly described.

2.1 Write Operation

A write operation of a semiconductor memory device according to the modification will be described.

2.1.1 Outline of Write Operation

First, an outline of the write operation according to the modification will be described.

In the write operation according to the modification, as an example, three types of voltages VPASS1, VPASS2, and VPASS3 are set as a voltage applied to a non-selected word line WL, and the voltages VPASS1 to VPASS3 are stepped up, respectively. The voltages VPASS1 to VPASS3 are applied to any one of the non-selected word lines WL according to a positional relation between the non-selected word line WL and the selected word line WL.

The voltage VPASS3 is set as a voltage which is applied to non-selected word lines WL (x±1) connected to memory cell transistors MT (x±1) adjacent on either side of a selected memory cell transistor MTx (where x is an integer 0≤x≤47) along the Z direction, for example. The voltage VPASS1 is set as a voltage which is applied to a non-selected word line WLy connected to a memory cell transistor MTy (where y is an integer of 0≤y<(x−1)) provided on the side of the selection transistor ST2 from the selected memory cell transistor MTx. The voltage VPASS2 is set as a voltage which is applied to a non-selected word line WLz connected to a memory cell transistor MTz (where z is an integer of (x+1)<z≤47) provided on the side of the selection transistor ST1 from the memory cell transistor MT (x+1).

The magnitude relation between the voltages VPASS1 to VPASS3 can be arbitrarily set. In addition, different values may be set for the voltages VPASS1 to VPASS3, and any two voltages may be set to have the same value.

Description will be made on a case in which all the voltages VPASS1 to VPASS3 are stepped up during the writing operation. It should be noted that the disclosure is not limited thereto. For example, any one of the voltages VPASS1 to VPASS3 could be stepped up, and other voltages need not be stepped up. The step-up increments of the voltages can be arbitrarily selected and changed.

2.1.2 Write Operation on Cell in Lower Layer Region

First, a write operation on a cell in the lower layer region on the side of the selection transistor ST2 will be described.

Figure 8:
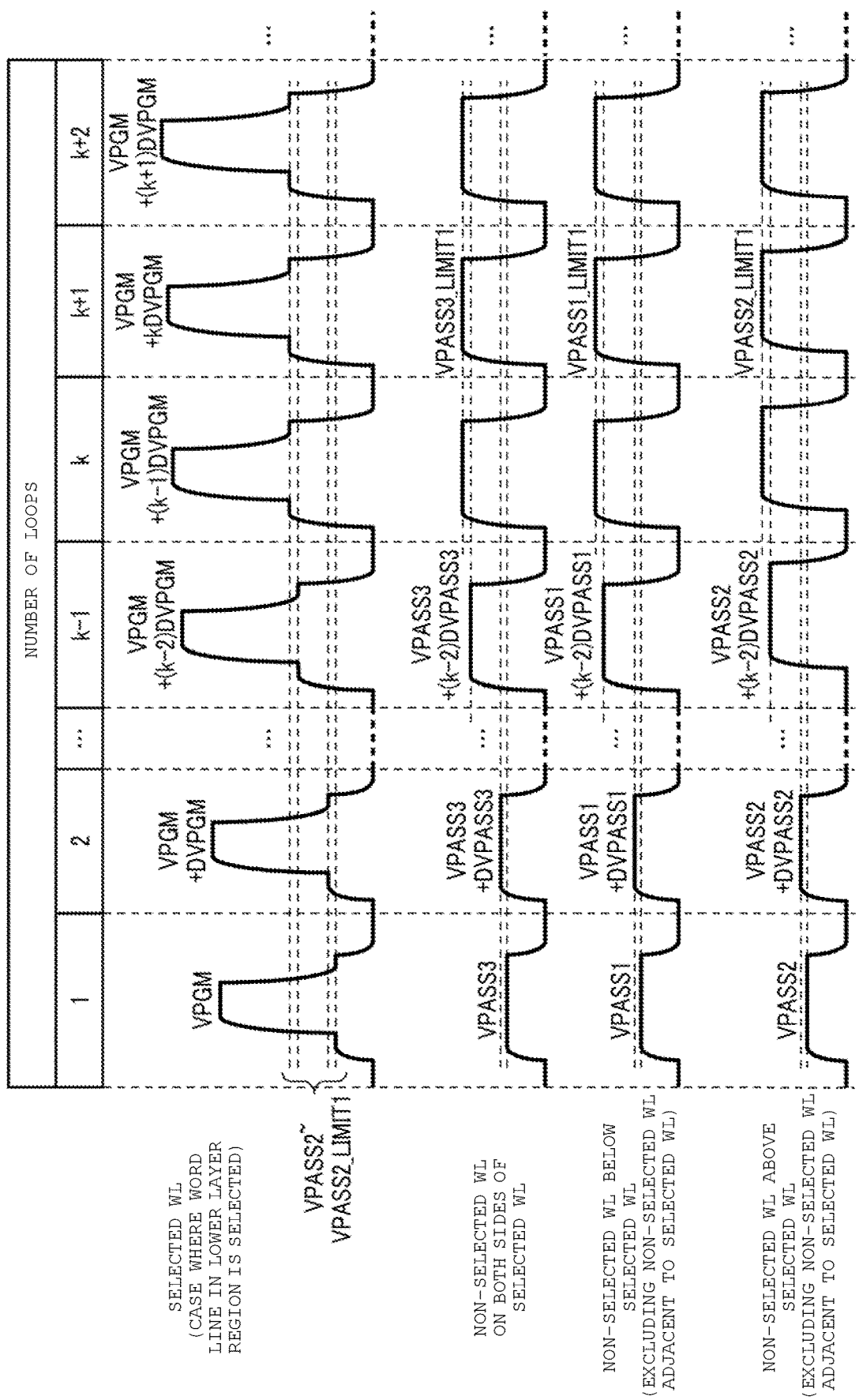
FIG. 8 is a timing chart for explaining aspects of a write operation when a word line in a lower layer region is selected in a semiconductor memory device according to a modified embodiment.

FIG. 8 is a timing chart for describing the write operation on the cell in the lower layer region in the semiconductor memory device of the modification. FIG. 8 corresponds to FIG. 5 described in the first embodiment. That is, FIG. 8 illustrates a case where to the selected cell is in the lower layer region.

In a first loop, as illustrated in FIG. 8, a voltage VPGM is applied to a selected word line WL after a voltage VPASS2 is applied, and electrons are injected into the charge storage layer 35 of the selected memory cell transistor MT. Thus, voltages VPASS1 to VPASS3 are applied to the various non-selected word lines WL, respectively according to the positional relation to the selected word line WL. Specifically, the voltage VPASS3 is applied to the non-selected word lines WL on both sides of the selected word line WL. The voltage VPASS1 is applied to the non-selected word lines WL (excluding one non-selected word line WL directly adjacent to the selected word line WL) below the selected word line WL. The voltage VPASS2 is applied to the non-selected word lines WL (excluding the one non-selected word line WL directly adjacent to the selected word line WL) above the selected word line WL.

Thereafter, a voltage VPASS2 is applied to the selected word line WL, then a voltage VSS is applied to both the selected word line WL and the non-selected word line WL, and the first program operation is completed.

In a second loop, the voltages VPGM, VPASS1, VPASS2, and VPASS3 are stepped up, for example, by voltages DVPGM, DVPASS1, DVPASS2, and DVPASS3, respectively, from the first loop. The voltages DVPASS1 to DVPASS3 may be set to have different values, or at least two of these voltages may be set to have the same value.

Specifically, in the second loop, after a voltage VPASS2+DVPASS2 is applied to the selected word line WL, a voltage VPGM+DVPGM is applied. Thus, voltages VPASS1+DVPASS1, VPASS2+DVPASS2, and VPASS3+DVPASS3 are respectively applied to the non-selected word lines WL according to the positional relation with the selected word line WL.

Thereafter, a voltage VPASS2+DVPASS2 is applied to the selected word line WL. Subsequently, a voltage VSS is applied to both the selected word line WL and the non-selected word line WL, and the second program operation is completed.

In the program operation, as described above, as the number of loops increases, the voltages applied to the selected word line WL and the non-selected word line WL are incrementally stepped up. In a (k−1)-th loop, for example, a voltage VPGM +(k−2)×DVPGM is applied to the selected word line WL after a voltage VPASS+(k−2)×DVPASS2 is applied, and voltages VPASS1+(k−2)×DVPASS1, VPASS2+(k−2)×DVPASS2, and VPASS3+(k−2)×DVPASS3 are respectively applied to the non-selected word lines WL according to the positional relation with the selected word lines WL. Then, after the voltage VPASS2+(k−2)×DVPASS2 is applied to the selected word line WL, a voltage VSS is applied to both the selected word line WL and the non-selected word line WL.

Subsequently, in a k-th loop, a voltage applied to the non-selected word line WL is stepped up to reach voltages VPASS1_LIMIT1, VPASS2_LIMIT1, and VPASS3_LIMIT1 according to the positional relation with the selected word line WL. The voltages VPASS1_LIMIT1 to VPASS3_LIMIT1 are one piece of information transferred from the logic control circuit 23 to the voltage generation circuit 26 during the write operation, and are upper limit values of the voltages VPASS1 to VPASS3, for example.

In the example of FIG. 8, the voltage VPASS1_LIMIT1 is larger than the voltage VPASS1+(k−2)×DVPASS1, and is equal to or smaller than the voltage VPASS1+(k−1)×DVPASS1. The voltage VPASS2_LIMIT1 is larger than the voltage VPASS2+(k−2)×DVPASS2, and is equal to or smaller than the voltage VPASS2+(k−1)×DVPASS2. The voltage VPASS3 LIMIT1 is larger than the voltage VPASS3+(k−2)×DVPASS3, and is equal to or smaller than the voltage VPASS3+(k−1)×DVPASS3. As a result, in the subsequent loop, the voltage applied to the non-selected word line WL is not stepped up to a value larger than the voltages VPASS1_LIMIT1 to VPASS3_LIMIT1 according to the positional relation with the selected word line WL.

That is, in the k-th and subsequent loops, for example, k-th, (k+1)-th, and (k+2) loops, after the voltage VPASS2_LIMIT1 is applied to the selected word line WL, voltages VPGM+(k−1)×DVPGM, VPGM+k×DVPGM, and VPGM+(k+1)×DVPGM are applied, respectively. Thus, any one of the voltages VPASS1_LIMIT1 to VPASS3_LIMIT1 is applied to the non-selected word line WL according to the positional relation with the selected word line WL in any loop. Then, after the voltage VPASS2_LIMIT1 is applied to the selected word line WL, the voltage VSS is applied to both the selected word line WL and the non-selected word line WL, and k-th, (k+1)-th, and (k+2)-th program operations are completed.

By the operation as described above, the write operation in the case where the word line WL in the lower layer region on the side of the selection gate line SGS is selected is completed.

2.1.3 Write Operation on Cell in Upper Layer Region

Subsequently, a write operation on a cell in the upper layer region on the side of the selection transistor ST1 will be described.

Figure 9:
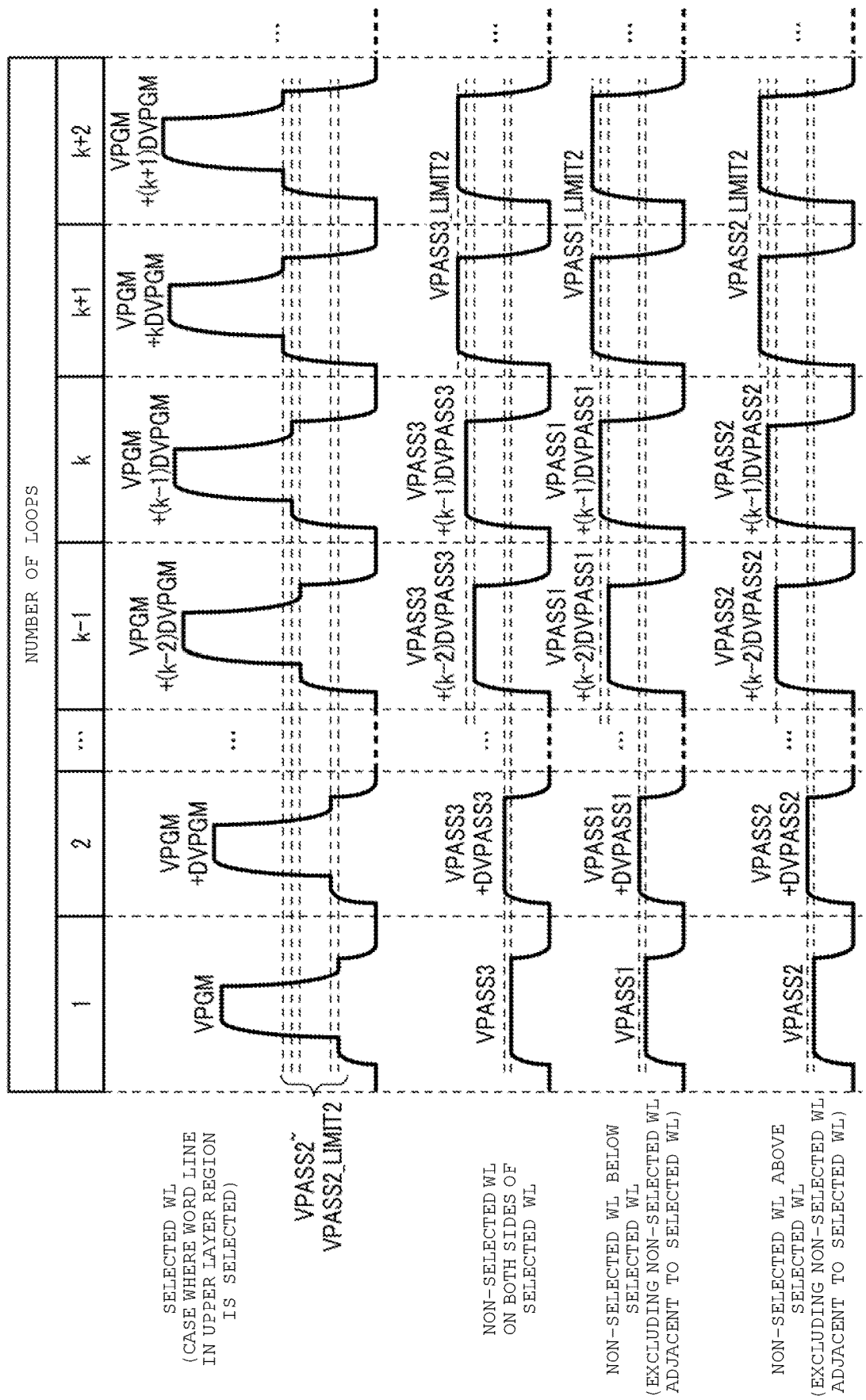
FIG. 9 is a timing chart for explaining aspects of a write operation when a word line in an upper layer region is selected in the semiconductor memory device according to a modified embodiment.

FIG. 9 is a timing chart for describing the write operation on the cell in the upper layer region in the semiconductor memory device of the modification. FIG. 9 corresponds to FIG. 6 described in the first embodiment. That is, FIG. 9 illustrates a case where the word line WL connected to the cell in the upper layer region is selected.

As illustrated in FIG. 9, since an operation up to a (k−1)-th loop is the same as the write operation on the cell in the lower layer region illustrated in FIG. 8, the description thereof will not be re-presented.

In a k-th loop, a voltage applied to the non-selected word line WL is stepped up to reach voltages VPASS1_LIMIT1 to VPASS3_LIMIT1 according to the positional relation with the selected word line WL. In subsequent loops, however, the sequencer 25 continues to step up the voltage applied to the non-selected word line WL without stopping the step-up to a voltage larger than the voltages VPASS1_LIMIT1 to VPASS3_LIMIT1.

Specifically, for example, in the k-th loop, after a voltage VPASS2+(k−1)×DVPASS2 has been applied to the selected word line WL, a voltage VPGM+(k−1)×DVPGM is applied. Thus, any one of the voltages VPASS1+(k−1)×DVPASS1, VPASS2+(k−1)×DVPASS2, and VPASS3+(k−1)×DVPASS3 is applied to the non-selected word line WL according to the positional relation with the selected word line WL. Thereafter, a voltage VPASS2 +(k−1)×DVPASS2 is applied to the selected word line WL. Subsequently, a voltage VSS is applied to both the selected word line WL and the non-selected word line WL, and the k-th program operation is completed.

Subsequently, in a (k+1)-th loop, voltages applied to the non-selected word line WL (excluding the non-selected word line WL adjacent to the selected word line WL) provided below the selected word line WL, the non-selected word line WL (excluding the non-selected word line WL directly adjacent to the selected word line WL) provided above the selected word line WL, and the non-selected word line WL on both sides of the selected word line WL are stepped up to reach voltages VPASS1_LIMIT2, VPASS2_LIMIT2, and VPASS3_LIMIT2, respectively. Each of the voltages VPASS1_LIMIT2 to VPASS3_LIMIT2 are one piece of information transferred from the logic control circuit 23 to the voltage generation circuit 26 during the write operation. The voltages VPASS1_LIMIT2 to VPASS3_LIMIT2 are upper limit values of the voltages VPASS1 to VPASS3 different from the voltages VPASS1_LIMIT1 to VPASS3_LIMIT1, respectively.

In the example of FIG. 9, the voltages VPASS1_LIMIT2 to VPASS3_LIMIT2 are greater than the voltages VPASS1 +(k−1)×DVPASS1 to VPASS3+(k−1)×DVPASS3, respectively, and are equal to or less than the voltages VPASS1+k×DVPASS1 to VPASS3+k×DVPASS3, respectively. As a result, in the subsequent loops, the voltages applied to the non-selected word line WL (excluding the non-selected word line WL directly adjacent to the selected word line WL) provided below the selected word line WL, the non-selected word line WL (excluding the non-selected word line WL directly adjacent to the selected word line WL) provided above the selected word line WL, and the non-selected word line WL on both sides of the selected word line WL are not stepped up to values larger than the voltages VPASS1_LIMIT2 to VPASS3_LIMIT2, respectively.

That is, in the (k+1)-th and subsequent loops, for example, (k+1)-th and (k+2)-th loops, after the voltage VPASS2_LIMIT2 is applied to the selected word line WL, voltages VPGM+k×DVPGM and VPGM+(k+1)×DVPGM are applied, respectively. Thus, any one of the voltages VPASS1_LIMIT2 to VPASS3_LIMIT2 is applied to the non-selected word line WL according to the positional relation with the selected word line WL. Then, after the voltage VPASS2_LIMIT2 is applied to the selected word line WL, the voltage VSS is applied to both the selected word line WL and the non-selected word line WL, and (k+1)-th and (k+2)-th program operations are completed.

By the operation as described above, the write operation in the case where the word line WL in the upper layer region on the side of the selection gate line SGD is selected is completed.

In the examples of FIGS. 8 and 9, the voltages applied to the non-selected word lines WL on both sides of the selected word line WL and the non-selected word line WL (excluding the non-selected word line WL adjacent to the selected word line WL) provided below the selected word line WL respectively reach the voltages VPASS1_LIMIT1 to VPASS3_LIMIT1 in the k-th loop and respectively reach the voltages voltage VPASS1_LIMIT2 to VPASS3_LIMIT2 in the (k+1)-th loop. However, examples are not limited thereto. For example, as long as the voltages VPASS1_LIMIT2 to VPASS3_LIMIT2 are larger than the voltages VPASS1_LIMIT1 to VPASS3_LIMIT1, respectively, the voltages applied to the non-selected word lines WL can be set to a reachable size in an arbitrary number of loops such as the (k+1)-th loop or more.

In the examples of FIGS. 8 and 9, the voltages applied to the non-selected word line WL start the step-up from the second loop together with the voltage applied to the selected word line WL regardless of the positional relation with the selected word line WL, but examples are not limited thereto. Each of the voltages may independently start the step-up from an arbitrary number of loops.

2.2 Effects According to Modification

Effects according to the modification will be described below.

In order to prevent the increase in the threshold voltage of the memory cell transistor MT connected to the selected word line WL in the non-selected string unit SU, as described above, it is effective to increase the potential of the channel of the memory cell transistor MT. However, even when a large voltage is uniformly applied to all the non-selected word lines WL, the effect of increasing the potential of the channel may not be sufficiently obtained in some cases.

According to the modification, the voltage VPASS1 is applied to the non-selected word line WL (excluding the non-selected word line WL adjacent to the selected word line WL) provided below the selected word line WL in the same NAND string NS. In addition, the voltage VPASS2 is applied to the non-selected word line WL (excluding the non-selected word line WL adjacent to the selected word line WL) provided above the selected word line WL. Further, the voltage VPASS3 is applied to the non-selected word lines WL provided on both sides of the selected word line WL.

As a result, the voltages of different values are applied to the non-selected word line WL in the same loop according to the positional relation between the non-selected word line WL and the selected word line WL. For this reason, it is possible to effectively prevent the increase in the threshold voltage of the memory cell transistor connected to the selected word line WL in the non-selected string unit SU while appropriately setting the magnitude of the voltage applied to the non-selected word line WL for each word line WL. While an example of applying the voltage VPASS3 to the non-selected word lines WL on both sides of the selected word line WL is described above, it is also possible for the voltage VPASS3 to be applied to only the word line WL on the upper side of the selected word line WL. In this case, the voltage VPASS1 or VPASS2 may be applied to the word line WL on the lower side of the selected word line WL depending on the position.

3. Others

In the modification described above, the description has been made on the case in which two upper limit values (voltages VPASS1_LIMIT1 to VPASS3_LIMIT1 and voltages VPASS1_LIMIT2 to VPASS3_LIMIT2) are set for all the non-selected word lines WL. It should be noted that the disclosure is not limited thereto.

For example, even when two upper limit values are set for all the non-selected word line WL, the effect of preventing the non-selected memory cell transistor MT from being unintentionally written may not be sufficiently obtained depending on the particular characteristics of the memory cell transistor MT. More specifically, for example, when the voltage VPASS2_LIMIT2 is applied to the non-selected word line WL above the selected word line WL and the voltage VPASS3_LIMIT2 is applied to the non-selected word lines WL on both sides of the selected word line WL, the effect of preventing the non-selected memory cell transistor MT from being unintentionally written may not be sufficiently obtained. On the contrary, when a large voltage is applied to the non-selected word line WL, data may be unintentionally written to the non-selected memory cell transistors MT.

In such a case, the number of upper limit values set for the non-selected word lines WL may be differ depending on the positional relation with the selected word line WL.

For example, one kind of voltage VPASS2_LIMIT1 may be set as the upper limit value for the non-selected word line WL above the selected word line WL, regardless of whether the selected word line WL is provided in the upper layer region. Further, for example, one kind of voltage VPASS3_LIMIT1 may be set as the upper limit value for the non-selected word lines WL on both sides of the selected word line WL, regardless of whether the selected word line WL is provided in the upper layer region. In contrast, different types of voltages VPASS1_LIMIT1 and VPASS1_LMIT2 may be respectively set as the upper limit value for the non-selected word line WL below the selected word line WL according to whether the selected word line WL is provided in the upper layer region.

Thus, it is possible to set whether a selected word line WL changes the upper limit value for the non-selected word lines WL according to the positional relation with the selected word line WL. For this reason, it is possible to effectively prevent the increase in the threshold voltage of the memory cell transistor MT connected to the selected word line WL in the non-selected string unit SU and to further improve the reliability of data writing. FIGS. 5, 6, 8 and 9 illustrate that the voltages VPGM and VPASS applied to the word lines WL are brought to the voltage VSS in every loop. In reality, the write operation may include the above-described program operation and a verify operation performed subsequently to the program operation. In the program operation, the program voltage VPGM is applied to the selected word line WL in order to increase the threshold voltage of the selected memory cell transistor MT. Meanwhile, in the verify operation, a verify voltage is applied to the selected word line in order to verify or test whether the threshold voltage of the selected memory cell transistor MT has been sufficiently increased to a target value as a result of the program operation. In view of this, the voltages VPGM and VPASS applied to the word lines WL in the program operation may not be completely discharged down to the voltage VSS so long as the voltages of the word lines WL are brought to a low enough voltage to start the verify operation.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor memory device, comprising:
a first bit line;
a drain-side selection gate transistor connected to the first bit line;
a source line;
a source-side selection gate transistor connected to the source line;
a plurality of serially connected memory cell transistors between the drain-side selection gate transistor and the source-side selection gate transistor, the memory cell transistors including a first memory cell transistor, the first memory cell transistor being closer to the source-side selection gate transistor than the drain-side selection gate transistor, a second memory cell transistor, the second memory cell transistor being closer to the drain-side selection gate transistor than the source-side selection gate transistor, and a third memory cell transistor;
a plurality of word lines coupled to gates of the memory cell transistors, the word lines including a first word line coupled to a gate of the first memory cell transistor, a second word line coupled to a gate of the second memory cell transistor, and a third word line coupled to a gate of the third memory cell transistor; and
a controller configured to:
perform a first write operation to write data to the first memory cell transistor with the first word line as a selected word line, and the second word line and the third word line as non-selected word lines, and
perform a second write operation to write data to the second memory cell transistor with the second word line as the selected word line, and the first word line and the third word line as the non-selected word lines, wherein, in each of the first write operation and the second write operation, a plurality of program loops, in each of which a program voltage is applied to the selected word line and a pass voltage lower than the program voltage is applied to the non-selected word lines:

the program voltage is stepped up from a first one of the program loops to a last one of the program loops;

the pass voltage in the first write operation is stepped up from the first one of the program loops to the last one of the program loops until the pass voltage reaches a first upper limit value, and the pass voltage in the second write operation is stepped up from the first one of the program loops to the last one of the program loops until the pass voltage reaches a second upper limit value that is higher than the first upper limit value; and the first upper limit value of the pass voltage is applied as the pass voltage in the first write operation after the pass voltage has reached the first upper limit value in the first write operation, and the second upper limit value of the pass voltage is applied as the pass voltage in the second write operation after the pass voltage has reached the second upper limit value in the second write operation.

2. The semiconductor memory device according to claim 1, wherein the pass voltage applied to the third word line in the first one of the program loops of the first write operation is the same with the pass voltage applied to the third word line in the first one of the program loops of the second write operation, and the pass voltage applied to the third word line in the last one of the program loops of the first write operation is lower than the pass voltage applied to the third word line in the last one of the program loops of the second write operation.

3. The semiconductor memory device according to claim 1, wherein the source-side selection gate transistor is disposed between a semiconductor substrate and the memory cell transistors.

4. The semiconductor memory device according to claim 1, wherein the third memory cell transistor is closer to the source-side selection gate transistor than the drain-side selection gate transistor, and the second memory cell transistor is between the third memory cell transistor and the drain-side selection gate transistor.

5. The semiconductor memory device according to claim 1, further comprising:

a fourth memory cell transistor connected to the third word line, wherein the fourth memory cell transistor is connected to a second bit line.

6. A semiconductor memory device, comprising:

a first memory cell connected to a first bit line, a gate of the first memory cell being connected to a first word line;

a second memory cell connected to the first bit line, a gate of the second memory cell being connected to a second word line;

a third memory cell connected to the first bit line, a gate of the third memory cell being connected to a third word line, a first selection transistor connected to the first bit line;

a second selection transistor connected to the first bit line, the first, second, and third memory cells being between the first and second selection transistors;

a controller configured to:

step up a program voltage during a data writing operation in first increments, the program voltage being applied to a selected word line during the data writing operation, step up a first pass voltage during the data writing operation in second increments up to a first upper limit value, the first pass program voltage being applied to at least one non-selected word line during the data writing operation, and step up a second pass voltage during the data writing operation in third increments up to a second upper limit value, the second pass voltage being applied to at least one non-selected word line during the data writing operation, wherein the first upper limit value is set by the controller to a first value when the selected word line is the first word line and to a second value different from the first value when the selected word line is the second word line, and the second upper limit value is set by the controller to a third value when the selected word line is the first word line and to a fourth value different from the third value when the selected word line is the second word line.

7. The semiconductor memory device according to claim 6, wherein the first selection transistor is a source side selection transistor and the first memory cell is between the second memory cell and the first selection transistor, and the fourth value is larger than the third value.

8. The semiconductor memory device according to claim 6, wherein the first pass voltage is applied to non-selected word lines directly adjacent to the selected word line, and the second pass voltage is applied to non-selected word lines which are not directly adjacent to the selected word line.

9. The semiconductor memory device according to claim 6, wherein the first selection transistor is a source side selection transistor and the first memory cell is between the second memory cell and the first selection transistor, and the second value is larger than the first value.

10. A semiconductor memory device, comprising:

a first memory cell transistor, a second memory cell transistor, and a third memory cell transistor that are connected in series;

a word line that is coupled to a gate of the third memory cell transistor; and a controller configured to:

set a pass voltage to a first value, the pass voltage having the first value being applied to the word line during writing of data to the first memory cell transistor;

set the pass voltage to a second value, the second value that is different from the first value, the pass voltage having the second value being applied to the word line during writing of data to the second memory cell transistor;

step up the pass voltage applied to the word line during the writing of data to the first memory cell transistor incrementally from the first value to a first upper limit value, and step up the pass voltage applied to the word line during the writing of data to the second memory cell transistor incrementally from the second value to a second upper limit value that is different from the first upper limit value.

11. The semiconductor memory device according to claim 10, wherein the first memory cell transistor is closer to a source-side selection gate transistor than a drain-side selection gate transistor, and the second memory cell transistor is between the first memory cell transistor and the drain-side selection gate transistor, and the second value is greater than the first value.

12. The semiconductor memory device according to claim 10, wherein the first memory cell transistor, the second memory cell transistor, and the third memory cell transistor are in a NAND-type three-dimensional memory cell array.

* * * * *